United States Patent
Raberg

(10) Patent No.: US 10,649,043 B2
(45) Date of Patent: May 12, 2020

(54) MAGNETIC FIELD SENSOR DEVICE CONFIGURED TO SENSE WITH HIGH PRECISION AND LOW JITTER

(71) Applicant: Infineon Technologies AG, Neubiberg (DE)

(72) Inventor: Wolfgang Raberg, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 302 days.

(21) Appl. No.: 14/262,888

(22) Filed: Apr. 28, 2014

(65) Prior Publication Data

US 2015/0309128 A1    Oct. 29, 2015

(51) Int. Cl.
*G01R 33/09*    (2006.01)
*G01R 33/00*    (2006.01)

(52) U.S. Cl.
CPC ......... *G01R 33/09* (2013.01); *G01R 33/0041* (2013.01); *G01R 33/098* (2013.01)

(58) Field of Classification Search
CPC ... G01R 33/09; G01R 33/0041; G01R 33/098
USPC ........................................................ 324/252
See application file for complete search history.

(56) References Cited

U.S. PATENT DOCUMENTS

| | | | |
|---|---|---|---|
| 5,430,374 A * | 7/1995 | Metz | G01D 5/145 324/207.21 |
| 5,497,082 A * | 3/1996 | Hancock | 324/207.14 |
| 5,698,778 A * | 12/1997 | Ban | F02D 11/106 324/207.2 |
| 6,204,662 B1 * | 3/2001 | Shinjo | B82Y 25/00 257/427 |
| 6,246,233 B1 * | 6/2001 | Griffen | G01D 5/145 324/207.12 |
| 6,356,741 B1 * | 3/2002 | Bilotti | H03K 17/9517 307/116 |
| 6,771,472 B1 * | 8/2004 | Mao et al. | 360/314 |
| 7,112,957 B2 | 9/2006 | Bicking | |
| 7,855,554 B2 * | 12/2010 | Oohira | 324/251 |
| 7,872,322 B2 * | 1/2011 | Schott | G01R 33/07 257/426 |
| 8,610,430 B2 * | 12/2013 | Werth et al. | 324/252 |
| 8,698,488 B2 * | 4/2014 | Lohberg | G01D 5/24438 324/174 |
| 8,952,686 B2 | 2/2015 | Holman, Jr. | |
| 9,297,669 B2 * | 3/2016 | Werth et al. | 324/207.25 |
| 9,341,684 B2 * | 5/2016 | Sidman | 324/252 |
| 9,857,438 B2 * | 1/2018 | Werth | G01R 33/09 |

(Continued)

FOREIGN PATENT DOCUMENTS

WO    2006136577 A1    12/2006

OTHER PUBLICATIONS

Dick J G et al., Abstract of 2011CN-10084595, Oct. 26, 2011.*

*Primary Examiner* — Jay Patidar
(74) *Attorney, Agent, or Firm* — Eschweiler & Potashnik, LLC

(57) ABSTRACT

Magnetic field sensor devices and associated methods are disclosed. Magnetic field sensor devices may comprise a first magnetic field sensor having a first bridge part spatially separated from a second bridge part. In some implementations, a second magnetic field sensor may be arranged between the first bridge part and the second bridge part. With this arrangement, measurements read by the magnetic field sensor device have high precision and low jitter.

11 Claims, 6 Drawing Sheets

(56) References Cited

U.S. PATENT DOCUMENTS

| | | | |
|---|---|---|---|
| 2002/0093332 A1* | 7/2002 | Schroeder et al. ............ 324/251 |
| 2003/0030431 A1* | 2/2003 | Reininger ........... F15B 15/2807 |
| | | | 324/207.2 |
| 2004/0129934 A1* | 7/2004 | Takatsuka ....................... 257/40 |
| 2004/0244772 A1* | 12/2004 | Ikeda ....................... F02D 11/10 |
| | | | 123/399 |
| 2004/0257069 A1* | 12/2004 | Butzmann ............... G01P 3/488 |
| | | | 324/207.21 |
| 2007/0090831 A1* | 4/2007 | Matsumoto ............ G01D 5/145 |
| | | | 324/207.25 |
| 2008/0084205 A1* | 4/2008 | Zimmer ........................ 324/252 |
| 2008/0211490 A1* | 9/2008 | Kurata ................... B82Y 25/00 |
| | | | 324/207.21 |
| 2009/0045809 A1* | 2/2009 | Kasajima .............. B82Y 25/00 |
| | | | 324/252 |
| 2009/0058402 A1* | 3/2009 | Zimmer ................... G01P 3/487 |
| | | | 324/207.21 |
| 2009/0256552 A1* | 10/2009 | Guo .......................... G01B 7/30 |
| | | | 324/207.21 |
| 2009/0295375 A1* | 12/2009 | Oohira ................... G01D 5/145 |
| | | | 324/207.21 |
| 2009/0295382 A1 | 12/2009 | Sterling |
| 2009/0315543 A1* | 12/2009 | Guo ....................... G01D 5/145 |
| | | | 324/207.21 |
| 2010/0283458 A1* | 11/2010 | Doogue et al. ................ 324/252 |
| 2011/0031964 A1* | 2/2011 | Ko .......................... G01D 5/145 |
| | | | 324/207.25 |
| 2011/0056461 A1* | 3/2011 | Kondo .................... F02D 9/105 |
| | | | 123/403 |
| 2011/0187354 A1* | 8/2011 | Zieren .................... G01D 5/147 |
| | | | 324/207.21 |
| 2012/0262164 A1* | 10/2012 | Bartos ..................... G01R 33/09 |
| | | | 324/252 |
| 2013/0241544 A1* | 9/2013 | Zimmer ............... G01R 33/093 |
| | | | 324/252 |
| 2013/0328556 A1* | 12/2013 | Granig ................ G01R 33/093 |
| | | | 324/252 |
| 2013/0335074 A1* | 12/2013 | Dwyer ............. G01R 33/0029 |
| | | | 324/227 |
| 2014/0021571 A1* | 1/2014 | Lei ........................... G01B 7/30 |
| | | | 257/427 |
| 2014/0125267 A1* | 5/2014 | Suzuki ..................... 318/400.39 |
| 2014/0139213 A1* | 5/2014 | Cadugan .............. G01R 33/0023 |
| | | | 324/251 |
| 2015/0192433 A1* | 7/2015 | Onodera ................ G01D 5/145 |
| | | | 324/207.21 |
| 2015/0338444 A1* | 11/2015 | Ivanov et al. ................. 324/252 |
| 2016/0104835 A1* | 4/2016 | Whig et al. .................... 324/252 |
| 2017/0059360 A1* | 3/2017 | Zimmer .................... G01D 5/16 |
| 2017/0131368 A1* | 5/2017 | Kubik ...................... G01R 33/09 |

* cited by examiner

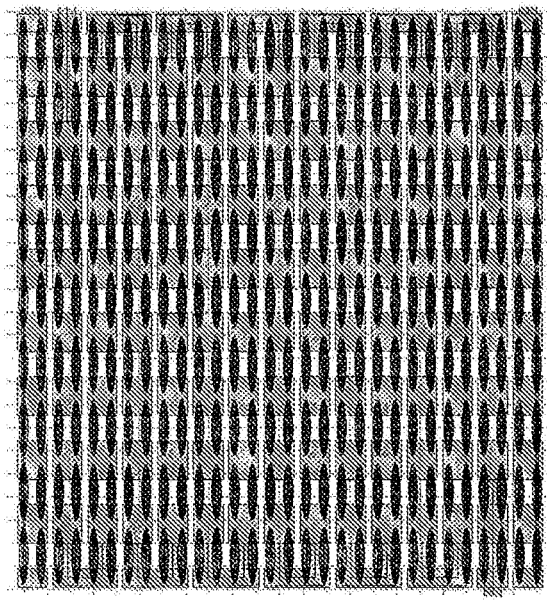
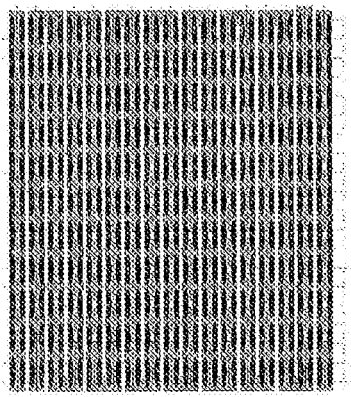
Fig. 5B
Fig. 5A
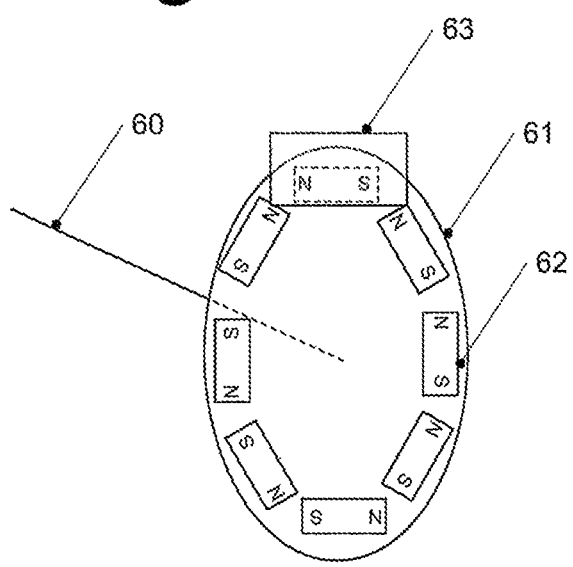
Fig. 6

MAGNETIC FIELD SENSOR DEVICE CONFIGURED TO SENSE WITH HIGH PRECISION AND LOW JITTER

TECHNICAL FIELD

The present application relates to magnetic field sensor devices, methods of operating magnetic field sensor devices and methods for manufacturing magnetic field sensor devices.

BACKGROUND

Magnetic field sensors are used in many applications. For example, for speed or movement detection, magnets may for example be provided on a so-called pole wheel, a magnetic encoder or other magnetic element, thus generating a modulated magnetic field when the pole wheel rotates. The modulation of the field may then be detected by a magnetic field sensor. The magnetic field detected thereby and its modulation are then indicative for example of a rotational speed of the pole wheel. Instead of a pole wheel, e.g. also a linear magnetic element generating a modulated magnetic field when moving may be used. For such a speed detection, in many applications a high accuracy and low jitter are required. To achieve this, in some applications sensors based on giant magnetoresistance (GMR) or tunnel magnetoresistance (TMR) have been increasingly used, although other types of magnetic field sensors like anisotropic magnetoresistance (AMR)-based sensors or Hall sensing elements may also be used. Besides detecting the speed, in some applications, it is desirable to also obtain some measure of the absolute magnetic field.

BRIEF DESCRIPTION OF THE DRAWINGS

FIGS. 5A and 5B are implementation examples of resistors usable in some embodiments.

FIG. 6 is an application example of some embodiments.

DETAILED DESCRIPTION

Figure 1:
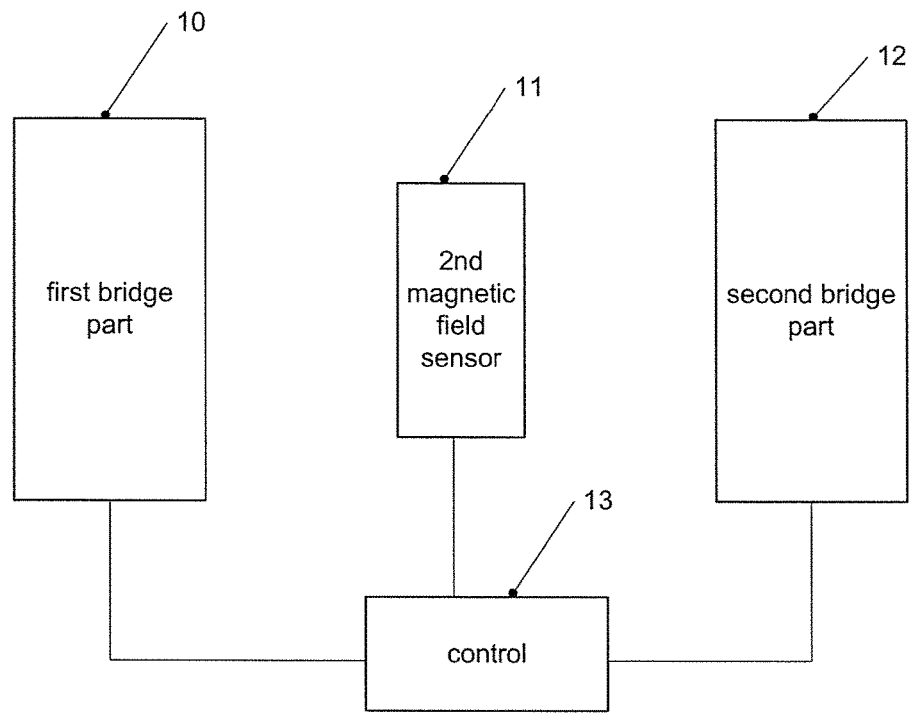
FIG. 1 is a schematic block diagram of a magnetic field sensor device according to an embodiment.

In the following, various embodiments will be described in detail with reference to the attached drawings. It is to be noted that these embodiments serve illustrative purposes only and are not to be construed as limiting. For example, while embodiments are described comprising a plurality of different details, features or elements, in other embodiments some of these details, features or elements may be omitted, may be implemented in a different manner than shown, and/or may be replaced by alternative details, features or elements. Additionally or alternatively, in other embodiments, additional details, features or elements not explicitly described herein may be present. Connections or couplings, for example electrical connections or couplings shown in the drawings or described herein may be direct connections or indirect connections, indirect connections being connections with one or more additional intervening elements, as long as the general function of the respective coupling or connection, for example to transmit a certain kind of information in form of a signal, is maintained. Furthermore, connections or couplings may be implemented as wire-based connections or wireless connections unless specifically noted otherwise.

In some embodiments, magnetic field sensor devices are provided. In some embodiments, a magnetic field sensor device may comprise a first magnetic field sensor and a second magnetic field sensor. The first magnetic field sensor may comprise a bridge circuit with spatially separated bridge branches, and the second magnetic field sensor may be arranged e.g. between the spatially separated bridge branches of the first magnetic field sensor. In some applications, the first magnetic field sensor may be used to sense a modulation of a magnetic field corresponding to a speed, whereas the second magnetic field sensor may be used to sense a measure of a magnetic field strength, for example corresponding to a proximity of a magnet to the magnetic field sensor device, e.g. an air gap between the magnet and the magnetic field sensor device. The second magnetic field sensor in some embodiments may also comprise a bridge circuit, with bridge branches of a second magnetic field sensor device being significantly closer to each other, for example smaller by about one order of magnitude or more, than at least some of the bridge branches of the first magnetic field sensor.

Turning now to the figures, in FIG. 1 a magnetic field sensor device according to an embodiment is shown. The embodiment of FIG. 1 comprises a first magnetic field sensor which comprises a bridge circuit. The bridge circuit comprises a first bridge part 10 and a second bridge part 12 which are spatially separate from each other. A distance between the first bridge part 10 and the second bridge part 12 may be more than 100 μm in one embodiment, for example of the order of some millimeters, but may also have other values. In some embodiments, the first magnetic field sensor comprising the first bridge part and the second bridge part may serve to detect a movement for example of a pole wheel or another entity which moves and generates a modulation of a magnetic field while moving. A modulation as used herein generally may refer to a variation over time and may be periodic or non-periodic.

In such an application, a distance between first bridge part 10 and second bridge part 12 may for example correspond to a pitch of the pole wheel or other moving magnetic device, for example a distance between individual magnets on the pole wheel or other magnetic device. First bridge part 10 and second bridge part 12 may be implemented using resistors based on materials and/or structures exhibiting, for example, a giant magnetoresistance (GMR) or a tunnel magnetoresistance (TMR), such that the presence of a magnetic field causes a change of resistance, which in turn leads to a change of one or more output voltages of the bridge circuit. Such output voltages may be received by a control circuit 13 to, for example, determine a speed of a magnetic device moving past the first magnetic sensor, as explained above. In other embodiments, control 13 may evaluate signals received from first and second bridge parts 10, 12 in any other way to obtain desired information based on a sensed magnetic field. In other embodiments, other magnetoresistive effects, generically referred to as XMR, may be used, for example anisotropic magnetoresistance (AMR) or colossal magnetoresistance (CMR).

Furthermore, the embodiment of FIG. 1 comprises a second magnetic field sensor 11. In embodiments, second magnetic field sensor 11 is located spatially between first bridge part 10 and second bridge part 12, although it need not be located in the middle between first bridge part 10 and second bridge part 12, but may also be located closer to either first bridge part 10 or second bridge part 12 or may be located elsewhere.

Second magnetic field sensor 11 in embodiments may be used to obtain a measure of a magnetic field strength at or near the magnetic field sensor device. Such a magnetic field strength may, for example, be indicative of a proximity of magnets, for example magnets of a pole wheel or other magnetic device, to the magnetic field sensor device. The signal from second magnetic field sensor 11 may be evaluated by control circuit 13 in some embodiments. In some embodiments, second magnetic field sensor 11 may also comprise a bridge circuit, bridge branches of the bridge circuit of the second magnetic field sensor being closer together than bridge branches of the first magnetic field sensor, for example within a distance of 10 to 50 µm, but not limited thereto. In other embodiments, the bridge branches of the first and/or second magnetic field sensors may be interlaced and/or nested with each other.

In some embodiments, second magnetic field sensor 11 may also comprise resistors made of materials and/or having structures leading to GMR or TMR effects, although other effects may as well be used for detecting magnetic fields. For example, in other embodiments, other magnetoresistive effects, generically referred to as XMR, may be used, for example anisotropic magnetoresistance (AMR) or colossal magnetoresistance (CMR).

In some embodiments, the first magnetic field sensor comprising first bridge part 10 and second bridge part 12 and the second magnetic field sensor 11, may be implemented for example on a semiconductor or other substrate using the same processing techniques for both magnetic field sensors. For example, this may be done in cases where the second magnetic field sensor 11 also uses a bridge circuit with resistors made of the same or similar materials than resistors of first bridge part 10 and second bridge part 12. In some embodiments, this may facilitate manufacturing the magnetic field sensor devices, for example simultaneous manufacturing of the first and second magnetic field sensors without additional processing steps.

It should be noted that in some applications, second magnetic field sensor 12 may also be implemented outside the first and second bridge branches 10, 11 of the first magnetic field sensor.

In some embodiments, a magnetic field acting on the first magnetic field sensor of the device of FIG. 1 also acts on the second magnetic field sensor or vice versa, even if the signals output may differ due to, for example, different geometries of the first and second magnetic field sensors. In some embodiments, this may be used to employ safety mechanisms. For example, when the first magnetic field sensor senses a modulated magnetic field without the second magnetic field sensor sensing anything, this may indicate a fault of the second magnetic field sensor (or even a fault of the first magnetic field sensor). Conversely, when the second magnetic field sensor senses a magnetic field, without the first magnetic field sensor sensing anything, this may be indicative of a fault of the first magnetic field sensor. Such circumstances which may indicate a fault may be detected by control circuit 13, and in case such a circumstance is detected, for example a signal indicating a possible fault may be output.

Figure 2:
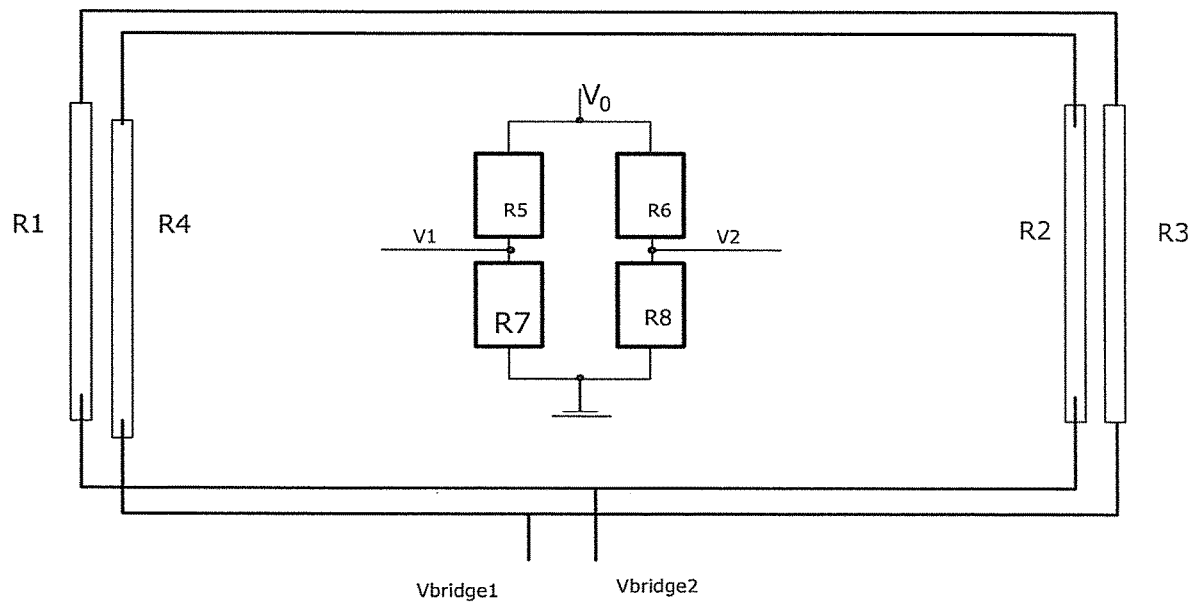
FIG. 2 is a schematic circuit diagram of a magnetic field sensor device according to an embodiment.

In FIG. 2, a magnetic field sensor device according to a further embodiment is shown. The magnetic field sensor device of FIG. 2 comprises a first magnetic sensor formed by a differential bridge circuit, comprising resistors R1 to R4, as shown. Resistors R1 to R4 may be made of or comprise materials and/or structures exhibiting a giant magnetoresistance (GMR) or a tunnel magnetoresistance (TMR), although in other embodiments other techniques may also be used. In some embodiments, resistors R1-R4 may have a same design, e.g. have a same transfer function describing their resistance depending on an applied magnetic field. Voltages obtainable from the differential bridge are labeled Vbridge1 and Vbridge2 in FIG. 2, and may, for example, be evaluated by a control circuit like control circuit 13 of FIG. 1 to obtain, for example, information regarding a speed of a magnetic device moving adjacent to the magnetic field sensor device. Such a magnetic device may, for example, comprise a pole wheel or a linear magnetic device comprising magnets.

Resistors R1 and R4 in FIG. 2 are an example for a first bridge part like first bridge part 10 of FIG. 1, and resistors R2 and R3 are an example for a second bridge part like second bridge part 12 in FIG. 1, the first bridge part being spatially separate from the second bridge part. In some embodiments, with an arrangement as shown in FIG. 2, detection of a movement with high precision and/or low jitter may be possible.

Furthermore, the embodiment of FIG. 2 comprises a second magnetic field sensor, which is implemented in the example embodiment of FIG. 2 as a Wheatstone bridge comprising resistors R5, R6, R7 and R8 which are coupled as shown in FIG. 2 between a supply voltage $V_0$ and ground. In other embodiments, other reference potentials may be used. Between resistors R5 and R7, a first voltage V1 may be tapped, and between resistors R6 and R8, a second voltage V2 may be tapped. Based on the first and second voltages V1 and V2, for example, based on a difference between V1 and V2, a measure for a magnetic field strength may be obtained. In some embodiments, R5 and R8 may be of a first resistor type, for example, a first size, and R6 and R7 may be of a second resistor type, for example, of a second size. For example, the first resistor type (say R6 and R7) may have a sensitivity range needed for the detection of a magnetic field range present in a specific application (for example a range of up to 3 milliteslas (mT). Obviously other magnetic field ranges may be used, depending on the application. The second resistor type, for example R5 and R8, may have a higher sensitivity range than the first resistor type, for example a sensitivity range as large as possible given design constraints and area constraints. For example, a width of resistors R6 and R7 may be approximately half a width of resistors R5 and R8 in some embodiments. For example, a width of resistors R6 and R7 may be approximately 0.8 µm and a width of R5 and R8 may be approximately 1.5 µm in some chip designs, although these values may vary depending e.g. on an application and/or depending on technologies used. Generally, in embodiments a design of at least one of the resistors R5-R8 may differ from a design of at least one other of the resistors R5-R8, leading to different transfer functions.

In some embodiments such a bridge configuration may allow the compensation of temperature offsets. The bridge formed by resistors R5 to R8 may also be referred to as a spatially concentrated bridge, as the bridge branches are close together, in contrast to the bridge branches formed by R1 to R4. For example, a distance between the bridge branches formed by resistors R5 to R8 may be about one order of magnitude smaller than a distance between the bridge branches of the bridge formed by R1 to R4.

Figure 3:
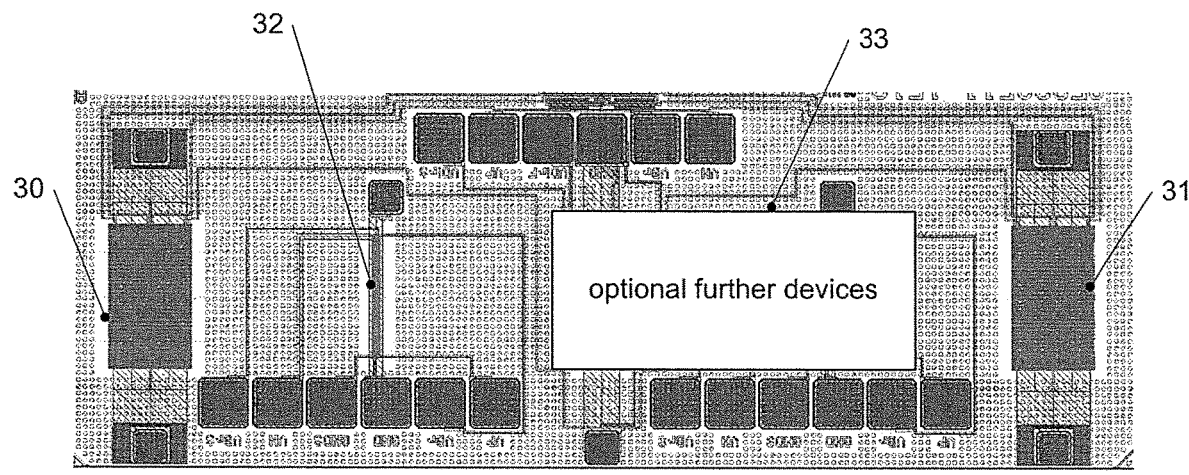
FIG. 3 is layout example of a magnetic field sensor device according to an embodiment.

In FIG. 3, a schematic circuit layout showing a possible implementation of the circuit illustrated in FIG. 2 is shown. The circuit layout of FIG. 3 serves only as an example and to illustrate implementation possibilities further and is not be construed as limiting. In the example of FIG. 3, a first bridge part is labeled 30 and may, for example, comprise resistors R1 and R4 of FIG. 2, a second bridge part is labeled 31 and may, for example, comprise resistors R2 and R3 of FIG. 2, and a second magnetic field sensor which may, for example, comprise resistors R5 to R8 of FIG. 2 is labeled 32 and is located between first bridge part 30 and second bridge part 31. Additionally, FIG. 3 shows contact pads for electrically contacting first bridge part 30, second bridge part 31 and second magnetic field sensor 32 as well as interconnections. In some embodiments the contact pads may be replaced by interconnections to underlying control circuitry. As can be seen, in the example implementation of FIG. 3, second magnetic field sensor 32 is not in the middle between first bridge part 30 and second bridge part 31, although in other implementations it may be located in the middle. Optionally, in a box labeled 33, further devices or elements may be provided, for example further resistances or a bridge circuit sensitive to a magnetic field or any other devices.

In some embodiments, second magnetic field sensor 32 and first and second bridge parts 30, 31 (e.g. all resistors R1-R8 in FIG. 2) may be formed by using a same process, e.g. using the same materials, which facilitates manufacturing the device of FIG. 3. In other embodiments some of the resistors of the second magnetic field sensor may be formed using identical layout but different materials or material thicknesses to create differences in transfer functions between different resistors of the second magnetic field sensor.

Figure 4:
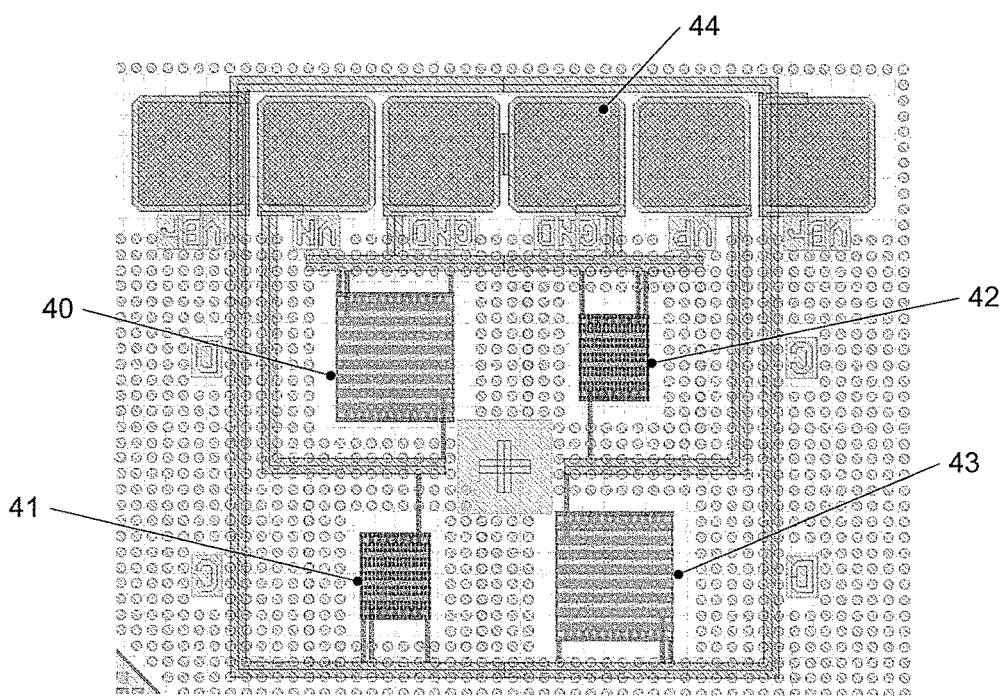
FIG. 4 is a layout example of a part of a magnetic field sensor device according to an embodiment.

In FIG. 4, an implementation example of a bridge circuit like the bridge circuit formed by resistors R5 to R8 of FIG. 2 is shown in more detail. In the circuit layout example of FIG. 4, two "larger" resistors 40 and 43, for example, resistors R5 and R8, and two resistors with reduced width 41 and 42, for example, resistors R6 and R7, are illustrated. Furthermore, the example circuit layout of FIG. 4 comprises interconnects and a plurality of contact pads 44, for example, for connecting with supply voltages (like $V_0$ or ground of FIG. 2) and for tapping output voltages (like V1 and V2 of FIG. 2). By the shown different dimensioning of resistors 40, 43 on the one hand and 41, 42 on the other hand, different sensitivities as explained above may be obtained. However, it is to be noted that this serves only as a simple example, and different sensitivities may also be obtained by other means, for example by choosing different materials, a different material thickness or different number of layers etc. In some embodiments, by designing R5 and R8 larger than R6 and R7, also a temperature dependency of R5 and R8 may be larger than a temperature dependency of R6 and R7, in case temperature dependent materials are used for implementation. However, in the bridge circuit design of the embodiment shown, this temperature dependency is compensated by the bridge circuit used.

In FIGS. 5A and 5B, layout examples for the resistors 40 to 43 of FIG. 4 are schematically shown. Such layouts may also be used for other embodiments than the one shown in FIG. 4. FIG. 5A for example shows an implementation example of resistors 40 and 43 of FIG. 4 and FIG. 5B shows an implementation example of resistors 41 and 42 of FIG. 4. The implementation of example of FIG. 5B is essentially a smaller version of the implementation example of FIG. 5A. In both cases, the resistor may be formed by a plurality of elliptical elements coupled in series and made of an appropriate material, for example a GMR or TMR material, or material stacks, as briefly explained below. In the example case of FIG. 5A, a size of the elliptical elements may, for example, be of the order of 2×12 µm, and in the example case of FIG. 5B a size of the elliptical elements may, for example, be of the order of 1.3×7.8 µm, although other sizes may also be used. This difference in sizes in embodiments may lead to a higher sensitivity of a resistor implemented as shown in FIG. 5A to magnetic fields compared to a resistor implemented as shown in FIG. 5B. It should be noted that the number, size and arrangement of elliptical elements is not limiting, and other numbers and arrangements may also be used. Furthermore, instead of elliptical elements also elements having another shape, for example rectangular or half moon shaped elements, may be used. In yet other examples, other structures may be used to implement magnetoresistive resistors.

Generally, the magnetoresistive resistors may be implemented as a conventional layer structure in some embodiments, for example comprising a seed layer, a reference system layer, a non-magnetic spacer layer, a free layer comprising a magnetically active material and a cap. The order of reference system layer and free layer may be exchanged. The free layer may comprise ferromagnetic materials like Co, Fe, Ni, alloys thereof, or alloys of these materials with other materials like CoFeB. Also multilayers like CoFe/NiFe bilayers, or coupled layers like CoFe/Ru/CoFe may be used as magnetically active materials within the free layer.

For the reference system layer the same magnetically active material(s) as for the free layer may be used, or other materials, for example magnetically active materials like antiferromagnetic materials, e.g. PtMn, IrMn, NiMn, CrPtMn or others. The non-magnetic spacer may comprise metals like Cu, Ag or Cr for GMR systems or non-conducting materials serving as a tunneling barrier like MgO, HfO, AlN or aluminum oxides. The seed layer may serve to improve crystal properties of the layer structure, and the cap layer protects the other layers. In other embodiments, other structures may be used.

Resistors R1 to R4 of the embodiment of FIG. 2 or generally bridge branches of a bridge circuit forming a first magnetic field sensor may be implemented in a similar manner as shown in FIGS. 5A and 5B, but in some embodiments may, for example, have different shapes and/or sizes than shown in FIGS. 5A and 5B, although other implementations may also be used. In case of similar implementations for the first and second magnetic field sensors, in some embodiments, this may facilitate a simultaneous manufacturing of first and second magnetic field sensors using, for example, same processes in production.

As already mentioned above, providing two magnetic field sensors may be helpful in safety critical applications as they provide redundancy. When the second magnetic field sensor is formed using a bridge circuit as illustrated in FIG. 2 (R5-R8) or FIG. 4, the second magnetic field sensor may also be used to measure a speed (e.g. of a pole wheel or linear element as will be explained below with reference to FIG. 6). As a trade-off the accuracy may in some embodiments be lower that a speed measurement using the first magnetic field sensor (e.g. resistors R1-R4). Even with lower accuracy however, such an additional speed measurement may provide redundancy or even diversity for the actual speed. The speed information obtained with both magnetic field sensors may be used in order to provide a higher level of functional safety and/or a plausibility check of a speed measured by the first magnetic field sensor.

On the other hand, as explained above, the second magnetic field sensor may be used to measure a magnetic field, e.g. to determine a proximity of a magnet to the magnetic field sensor device. In some embodiments additionally or alternatively a measuring of a static magnetic field strength, e.g. of a constant bias field, is made possible by the second magnetic field sensor, which may be implemented as a bridge circuit with a comparatively small distance between its bridge branches as explained above. In such an embodiment, therefore the second magnetic field sensor may serve both to measure a magnetic field strength and to measure at least a rough estimate of a speed to provide redundancy and/or a plausibility check.

In contrast thereto consider a device with e.g. two redundant differential bridges having bridge branches spaced apart from each other similar to the first magnetic field sensor described above. While speed could be measured with both bridges in a redundant way, measuring of an absolute field strength would be difficult, if not impossible with such a device.

FIG. 6 shows a possible application environment of magnetic field sensor devices of some embodiments, e.g., as discussed above. In the application example of FIG. 6, a magnetic field sensor device 63, which may be implemented, for example, as discussed above with respect to FIGS. 1 to 5, is placed adjacent to a pole wheel 61. Pole wheel 61 is mounted to an axle 60. When axle 60 rotates, pole wheel 61 also rotates. Pole wheel 61 has a plurality of magnets 62 arranged circumferentially at its periphery. The arrangement and number of magnets shown in FIG. 6 serves only as an example, and other arrangements or numbers of magnets may also be employed. Magnets 62 may be permanent magnets or electromagnets, to give some examples. When axle 60 and therefore pole wheel 61 rotates, the movement of magnets 62 causes a modulated magnetic field acting on magnetic field sensor device 63. The speed of modulation of the magnetic field in such an example is indicative of the speed of rotation.

The application of FIG. 6 serves merely as an example, and magnetic field sensor devices as disclosed herein may also be used for other applications. For example, in a different example instead of a pole wheel a linear magnetic element, for example, with a plurality of magnets arranged along its length, may be moving adjacent to magnetic field sensor device 63, thus also causing a modulated magnetic field. Such a linear magnetic element may, for example, be used to monitor linear actuators, hydraulic cylinders or other devices involving a linear movement. In applications as discussed above, the first magnetic field sensor discussed above may be used to measure a speed or may be used to measure the angular or linear position of a magnetic encoder. In such an embodiment, bridge branches of the first magnetic field sensor may have a spacing corresponding to about half the pitch of magnets 62 on pole wheel 61. When pole wheel 61 rotates, both bridge branches are exposed to a modulated magnetic field, with a phase difference between the bridge branches. For example, in case the device of FIG. 3 is used as magnetic field sensor device 63, magnets 62 pass resistors R1, R4 at a different time compared to resistors R2, R3, leading to a phase difference, which is indicative of the speed. Furthermore, the second magnetic field sensor may be used to measure a proximity of the magnets to the magnetic field sensor, e.g. an air gap, for example to ensure that a distance or spacing is correct. In this way, a correct positioning of the sensor device relative to the pole wheel may be monitored, e.g. according to the so called AK protocol used in some automotive applications, thus providing a safety function. Furthermore, as explained above, the presence of a second magnetic field sensor may add some redundancy which may lead to the detection of failures of one of the magnetic field sensors, which may be desired, e.g., for safety-critical applications.

In other embodiments, magnetic field sensor devices as illustrated above may be used, for example, for current sensing. A changing current leads to a changing magnetic field, which may for example be detected by the first magnetic field sensors discussed above, for example with a bridge circuit having spatially separate bridge branches. The second magnetic field sensor may then for example be used to detect external homogenous fields or a misalignment of the magnetic field sensor device, for example of a chip on which the magnetic field sensor device is implemented. In such embodiments, the second magnetic field sensor may be placed for example in the middle between the spatially separated bridge branches of the first magnetic field sensor.

Figure 7A:
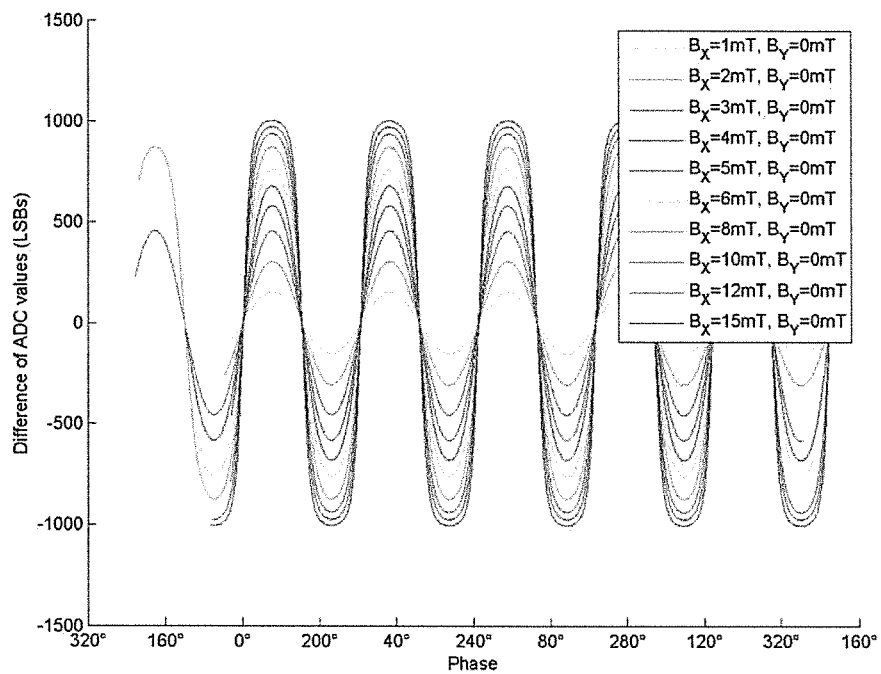
FIGS. 7A and 7B are diagrams illustrating the sensing of magnetic fields according to embodiments.
Figure 7B:
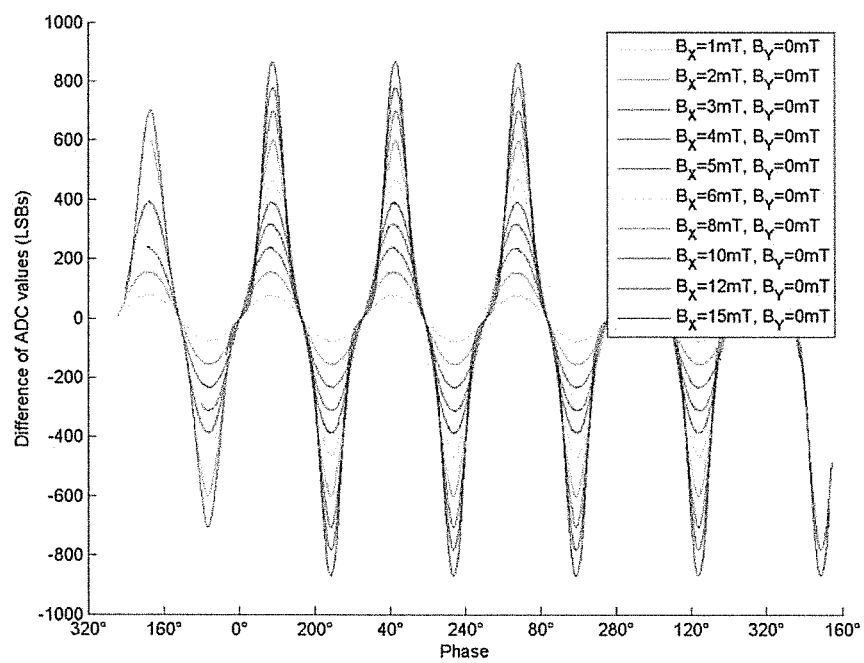
Figure 8:
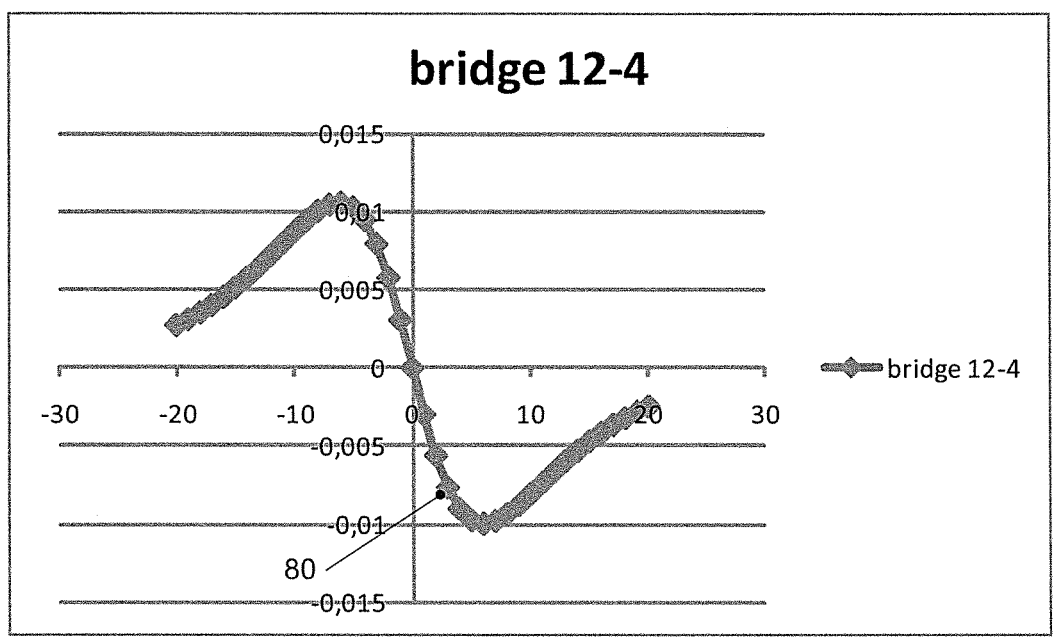
FIG. 8 is a diagram illustrating a response of a magnetic field sensor usable in some embodiments.

Next, to illustrate embodiments further, with reference to FIGS. 7A, 7B and 8, example signals output by the first and second magnetic field sensors of some embodiments will be illustrated. These example signals serve only for further illustration, and depending on implementation of the magnetic field sensors and external magnetic fields applied, these signals may look different.

In FIGS. 7A and 7B, example signals obtained from a first magnetic field sensor, e.g., as mentioned above, in the example of FIGS. 7A and 7B a magnetic field sensor comprising spatially separated bridge branches, are shown for different magnetic fields. FIG. 7A illustrates an example case where a distance between the spatially separate bridge branches is aligned to a pitch for example of a pole wheel. FIG. 7B illustrates a case with misalignment. As can be seen, the signals, including a peak signal strength, differ from each other. In such embodiments, it is therefore difficult to measure for example a proximity of the magnets of the pole wheel to the magnetic field sensor device based on the magnetic field measured, as the measured values depend on an alignment.

In FIG. 8, a curve 80 shows an example response of a spatially concentrated bridge serving as second magnetic field sensor, as, for example, illustrated in FIG. 2 or FIG. 4. The signal generated in response to an external field in a certain region around zero is linear and exhibits a low hysteresis in some embodiments. This may, for example, be used to measure a field strength, which in embodiments may, for example, serve as a measure for a proximity of the magnet to the magnetic field sensor device. In some embodiments, for example, magnetic fields with peak strength up to about 2500 A/m may be measured, although the second magnetic field sensor may also be designed for other values depending on the implementation and/or desired application.

Next, with reference to FIGS. 9 and 10 some methods according to some embodiments will be discussed. While the methods will be described as a series of acts or events, the order in which such acts or events are described is not to be construed as limiting. Other orders are equally possible, and acts or events described may also be performed concurrently with each other. For example, several magnetic field measurements using different sensors may be performed concurrently, and/or the formation of different magnetic field sensors for example on a chip may be performed concurrently using some processes.

Figure 9:
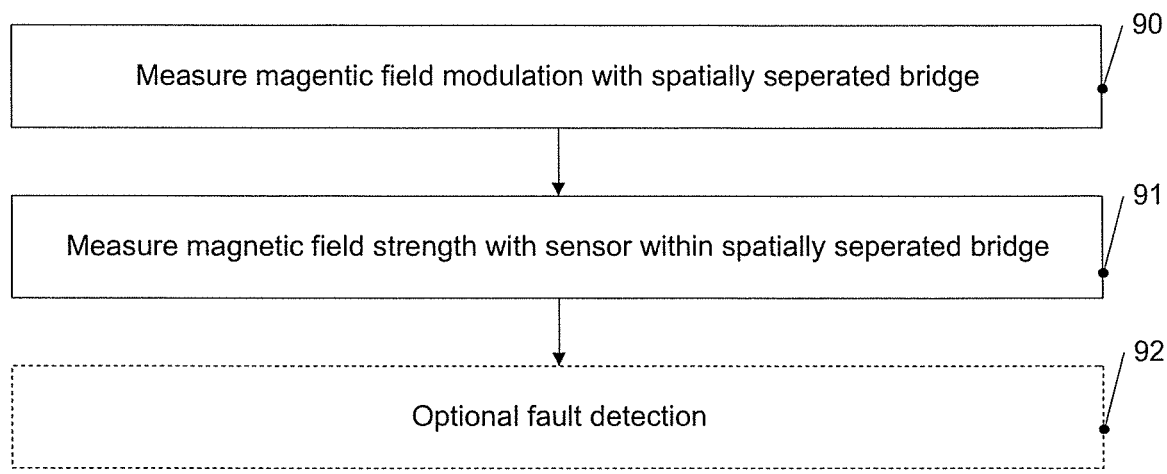
FIG. 9 is a flow chart illustrating a method of operating a magnetic field sensor device according to an embodiment.

In FIG. 9, a method for operating a magnetic field sensor device, for example, a magnetic field sensor device as discussed with respect to FIGS. 1 to 8 above, is illustrated. At 90, a magnetic field modulation, for example, indicative of a speed, is measured using a spatially separated bridge, i.e., a bridge circuit with spatially separate bridge branches. For example, for measuring the magnetic field modulation, the first magnetic field sensor as discussed above may be used. At 91, a magnetic field strength is measured with a sensor within the spatially separated bridge used at 90, for example, a second magnetic field sensor as explained above. This may be used in some embodiments to measure a proximity of a magnet. Optionally, at 92 a fault detection is performed, for example, when only at 90 or only at 91 a magnetic field is measured.

Figure 10:
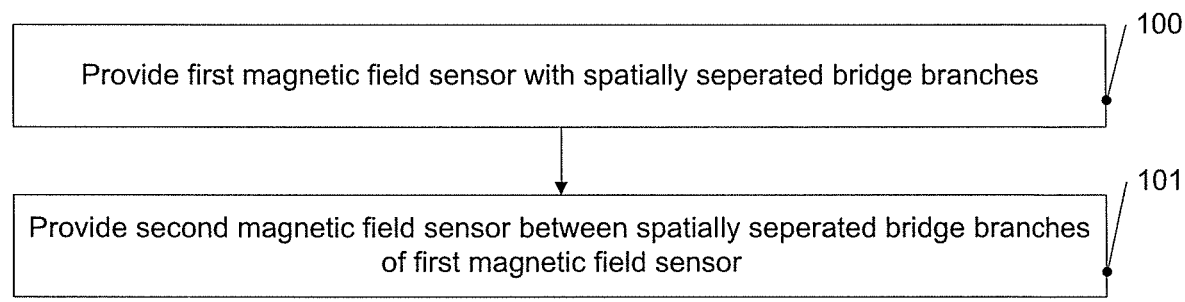
FIG. 10 is a flow chart illustrating a method of manufacturing a magnetic field sensor device according to an embodiment.

In FIG. 10, a method for manufacturing a magnetic field sensor device, for example, for manufacturing any of the magnetic field sensor devices discussed with reference to FIGS. 1 to 8 above, is shown. At 100, a first magnetic field sensor with spatially separated bridge branches is provided, for example, on a semiconductor substrate. At 101, the method of FIG. 9 comprises providing a second magnetic field sensor, for example, a bridge circuit having bridge branches adjacent to each other, between the spatially separated bridge branches of the first magnetic field sensor. Providing the first and second magnetic field sensors may comprise providing resistors made of materials and/or structures exhibiting a giant magnetoresistance (GMR) effect or a tunnel magnetoresistance (TMR) effect. In some embodiments, the acts described with respect to 100 and 101 may be performed simultaneously, for example using at least one common processing phase and/or using the same processes for providing the first and second magnetic field sensors. For example, the first and second magnetic field sensors may each have GMR or TMR elements having a layer structure as explained above. The at least one common processing phase may then e.g. comprise one or more material deposition phases to deposit materials like the ones mentioned above for forming the layer structures, for example magnetically active materials, one or more structuring phases, metallization phases and/or other phases needed to form the first and second magnetic field sensors. In some embodiments, only such common processing phases without separate processing may be used, although in other embodiments some part of the processing may be performed separately for the first and second magnetic field sensor.

It is to be emphasized again, that the above described embodiments serve only as examples and are not to be construed as limiting the scope of the present application, as the techniques disclosed herein may also be implemented in other ways than shown, as apparent to persons skilled in the art.

What is claimed is:

1. A magnetic field sensor device, comprising:
a first magnetic field sensor, the first magnetic field sensor comprising a first bridge circuit, a first bridge part of the first bridge circuit being spatially separate from a second bridge part of the first bridge circuit, the spatially separate first and second bridge parts with a spacing therebetween forming the first bridge circuit, and wherein the first bridge circuit comprises resistors based on a first transfer function that indicates a resistance of the resistors, and
a second magnetic field sensor, wherein the second magnetic field sensor is arranged spatially entirely in the spacing between the first bridge part and the second bridge part of the first bridge circuit, wherein the second magnetic field sensor comprises a second bridge circuit, wherein the second bridge circuit comprises a first resistor based on a second transfer function coupled in series with a second resistor based on a third transfer function different from the second transfer function, and a third resistor based on the third transfer function coupled in series with a fourth resistor based on the second transfer function, the series connection of the first and second resistors being coupled in parallel to the series connection of the third and fourth resistors, and wherein the first resistor, the second resistor, the third resistor, and the fourth resistor each exhibit at least one of a giant magnetoresistance and a tunnel magnetoresistance.

2. The device of claim 1, wherein the resistors of the first bridge circuit exhibit at least one of a giant magnetoresistance and a tunnel magnetoresistance.

3. The device of claim 1, wherein the second bridge circuit comprises at least one resistor comprising elliptical elements coupled in series.

4. The magnetic field sensor device of claim 1, wherein the first resistor and the fourth resistor have larger sensitivity ranges than the second resistor and the third resistor, and wherein the magnetic field sensor device further comprises a control circuit to derive a speed of modulation of a magnetic field from a measurement of the first magnetic field sensor and to derive a proximity of a magnet from a measurement of the second magnetic field sensor, the magnet being arranged on a moving object and adjacent to the magnetic field sensor device.

5. The device of claim 1, wherein the first bridge circuit comprises a differential bridge circuit.

6. The magnetic field sensor device of claim 1, wherein the first and second bridge circuits are arranged in a same plane.

7. The magnetic field sensor device of claim 1, wherein the first bridge circuit is configured to measure a first magnetic property, and wherein the second bridge circuit is configured to measure a second magnetic property different than the first magnetic property.

8. A magnetic field sensor device, comprising:
a first magnetic field sensor comprising a first bridge circuit having a first bridge part comprising first and fourth resistor elements, and a second bridge part comprising second and third resistor elements, wherein the first bridge part and the second bridge part are spatially separate from one another with a spacing therebetween, and wherein the first through fourth resistor elements comprise a same design based on a same transfer function that indicates a resistance of the first through fourth resistor elements; and
a second magnetic field sensor comprising a second bridge circuit entirely disposed in the spacing between the first bridge part and the second bridge part of the first bridge circuit of the first magnetic field sensor, wherein the first and fourth resistor elements are disposed on one side of the second magnetic field sensor, and the second and third resistor elements are disposed on a second, opposing side of the at least a portion of the second magnetic field sensor, wherein the second bridge circuit comprises fifth through eighth resistors each exhibiting at least one of a giant magnetoresistance and a tunnel magnetoresistance, and wherein the fifth resistor and the eighth resistor have larger sensitivity ranges than the sixth resistor and the seventh resistor.

9. The magnetic field sensor device of claim 8, wherein the first bridge circuit is configured to measure a first magnetic property, and wherein the second bridge circuit is configured to measure a second magnetic property different than the first magnetic property.

10. The magnetic field sensor device of claim 8, wherein the fifth resistor is based on a second transfer function and is coupled in series with the sixth resistor, wherein the sixth resistor is based on a third transfer function different from the second transfer function, wherein the seventh resistor is based on the third transfer function and is coupled with the eighth resistor, wherein the eight resistor is based on the second transfer function, and wherein the series connection of the fifth and sixth resistors being coupled in parallel to the series connection of the seventh and eighth resistors.

11. The magnetic field sensor device of claim 8, further comprising a control circuit to derive a speed of modulation of a magnetic field from a measurement of the first magnetic field sensor and to derive a proximity of a magnet from a measurement of the second magnetic field sensor, the magnet being arranged on a moving object and adjacent to the magnetic field sensor device.

* * * * *